United States Patent [19]
Owens

[11] Patent Number: 5,519,168
[45] Date of Patent: May 21, 1996

[54] ELECTROMAGNETIC INTERFERENCE SHIELDING

[76] Inventor: William M. Owens, 7235 E. Silver Saddle Rd., Flagstaff, Ariz. 86004

[21] Appl. No.: 133,880

[22] Filed: Oct. 12, 1993

[51] Int. Cl.$^6$ .................................................... H05K 9/00
[52] U.S. Cl. ........................... 174/35 MS; 250/515.1
[58] Field of Search ................ 174/35 MS, 35 R, 174/35 GC; 428/68, 35.8, 458; 250/515.1

[56] References Cited

U.S. PATENT DOCUMENTS

| | | | |
|---|---|---|---|
| 4,189,618 | 2/1980 | Bretts et al. | 174/35 MS |
| 4,474,676 | 10/1984 | Ishino et al. | 174/35 R X |
| 4,631,214 | 12/1986 | Hasegawa | 428/68 |
| 4,670,347 | 6/1987 | Lasik et al. | 428/458 |
| 4,678,716 | 7/1987 | Tzeng | 428/551 |
| 4,758,686 | 7/1988 | Takahashi et al. | 174/35 MS |
| 4,825,090 | 4/1989 | Grabis | 250/515.1 |
| 4,869,970 | 9/1989 | Gulla et al. | 428/621 |
| 4,931,326 | 6/1990 | Weil | 428/35.8 |
| 5,008,486 | 4/1991 | Terakawa et al. | 174/35 MS |
| 5,045,637 | 9/1991 | Sato et al. | 174/35 MS |

*Primary Examiner*—Morris H. Nimmo
*Assistant Examiner*—Christopher Horgan
*Attorney, Agent, or Firm*—Steptoe and Johnson

[57] ABSTRACT

A corrosion resistant electromagnetic interference shielding material for electronic enclosures is provided. The corrosion resistant composite material comprises a metallized, highly conductive porous polymeric material, laminated between two layers of corrosion resistant composite materials, incorporating ground lugs. The highly conductive material intercepts an electromagnetic interference signal and grounds the signal through the ground lugs provided in the outer composite shell. This invention is particularly useful where a lightweight, corrosion resistant electronic enclosure is required.

9 Claims, 3 Drawing Sheets

ELECTROMAGNETIC INTERFERENCE SHIELDING

FIELD OF THE INVENTION

The present invention relates to electromagnetic interference shielding materials and more particularly, to lightweight, corrosion resistant materials exhibiting high electromagnetic radiation or interference (EMI) shielding characteristics for use as electronic applications.

BACKGROUND OF THE INVENTION

Many electronic enclosures provide adequate shielding characteristics over a limited range of frequencies, and even provide some degree of protection from corrosion in a limited, or controlled environment. Wide range frequency protection can be provided by use of metal enclosures.

Many electronic enclosures are manufactured from sheet metals, such as aluminum or stainless steel. While these enclosures provide high shield attenuation over a wide range of frequencies, they are susceptible to corrosion in harsh environments, such as, high humidity and/or corrosive salt environments. Also, they are very heavy, due to the high density of the materials. Added corrosion resistance is provided by electro-chemical processing and/or corrosion resistant paints. These added processes are subject to cracking and peeling which will increase the possibility of corrosion, and high maintenance costs.

Other electronic enclosures are manufactured from molded plastics, such as, polyamides, polyester, nylon, and other copolymers. While these types of enclosures are lightweight and easily manufactured, polymers provide limited EMI shield attenuation. In order to provide adequate shield attenuation, these enclosures must be electro-chemically plated with a metallic substance, such as, copper, silver, nickel, or combinations of said materials. Said enclosure materials may be painted with a metallic filled paint, and in many cases a combination of metallic plating and paints. These enclosures provide limited, if any, corrosion resistance and are generally used in non-corrosive environments.

For many years, users of electronic enclosures have had to sacrifice some desired requirements in order to obtain more needed requirements. That is, if a user needs high shield attenuation over a wide range of frequencies, bat would also like to save space anti/or weight, they would sacrifice space/weight for the attenuation requirements. Likewise, other users may have sacrificed wide ranges of frequency for space and/or weight requirements.

In general, for installations in which there is great flexibility in space and weight considerations, or in a controlled environment where corrosion is not a consideration, effective EMI Shielded enclosures can be constructed from methods and materials well known in the art.

On the other hand, for installations of electronic enclosures, such as, mobile electronic systems, aircraft electronics, shipboard electronics, radio/telephone communications, missile guidance and control systems, space shuttle and space lab electronics, and the like, where wide ranges of frequency attenuation, space and weight, and harsh environments where corrosion is a major concern, there are few suitable materials from which to manufacture lightweight, corrosion resistant, high strength, high shield attenuation over a wide range of frequencies, electronic enclosures.

For many years, manufacturers and others have attempted to combine state of the art materials and technologies to produce a material that will provide lightweight, high attenuation, corrosion resistance, and high strengths for use as electronic enclosures. U.S. Pat. No. 4,916,016 describes a process for injection molding a polymerizing resin to the face of a metal foil or metal clad plastic foil. This process does not provide for corrosion resistance to the metal foil or film, and does not provide a solution to the problems of delamination or cracking trader stress. Others, such as, U.S. Pat. No. 4,474,685 and 4,566,990 describes processes for metal filling composite type molding compounds and conductive thermoplastic compounds. These processes genially sacrifice structural integrity and strength as the metal fiber composition increases to provide higher conductivities and shield attenuation.

SUMMARY OF THE INVENTION

The present invention provides a lightweight material that has high electromagnetic radiation shielding properties, excellent barrier properties to fine liquid and solvent particulates, high resistance to attack or damage by chemicals and other corrosives, while maintaining strength and structural integrity. Combinations of the preceding stated properties in a single material has been heretofore unknown.

The present invention can be readily fabricated by conventional means to form lightweight, high strength, corrosion resistant electronic enclosures that protect internal equipment from adverse influence or damage by electromagnetic radiation or interference from extraneous sources or nearby equipment over a wide range of frequencies.

Broadly described, the present invention comprises of a highly conductive, flexible inner membrane, immobilized by encapsulation within a high strength polymer composite sheet. The material can be molded or shaped into any configuration or size.

More specifically, referring to the drawings, FIG. 1 illustrates embodiments of an outer layer of fiberglass re-inforced resin, encapsulating an inner layer of a porous, conductive, flexible membrane with grounding apparatus attached.

FIG. 2 illustrates a further embodiment of the invention having substantially the same construction as FIG. 1, but that the outer layers include open areas that contain no resin, and said inner layer remains porous to allow air flow, providing an integral air vent for electronic equipment, while maintaining electromagnetic shielding protection.

FIG. 3 illustrates a further embodiment of the invention having an outer layer of a flexible material, laminated to an inner layer of the porous, conductive, flexible membrane.

Porous is used herein to describe materials that allow passage of gases and/or liquids. These are materials that comprise interconnected pores and voids that form passages extending through the thickness of the material. The passageways open on both sides of the material, but are not directly open through the cross-section of the material.

DESCRIPTION OF THE PREFERRED EMBODIMENTS OF THE INVENTION

Figure 1:
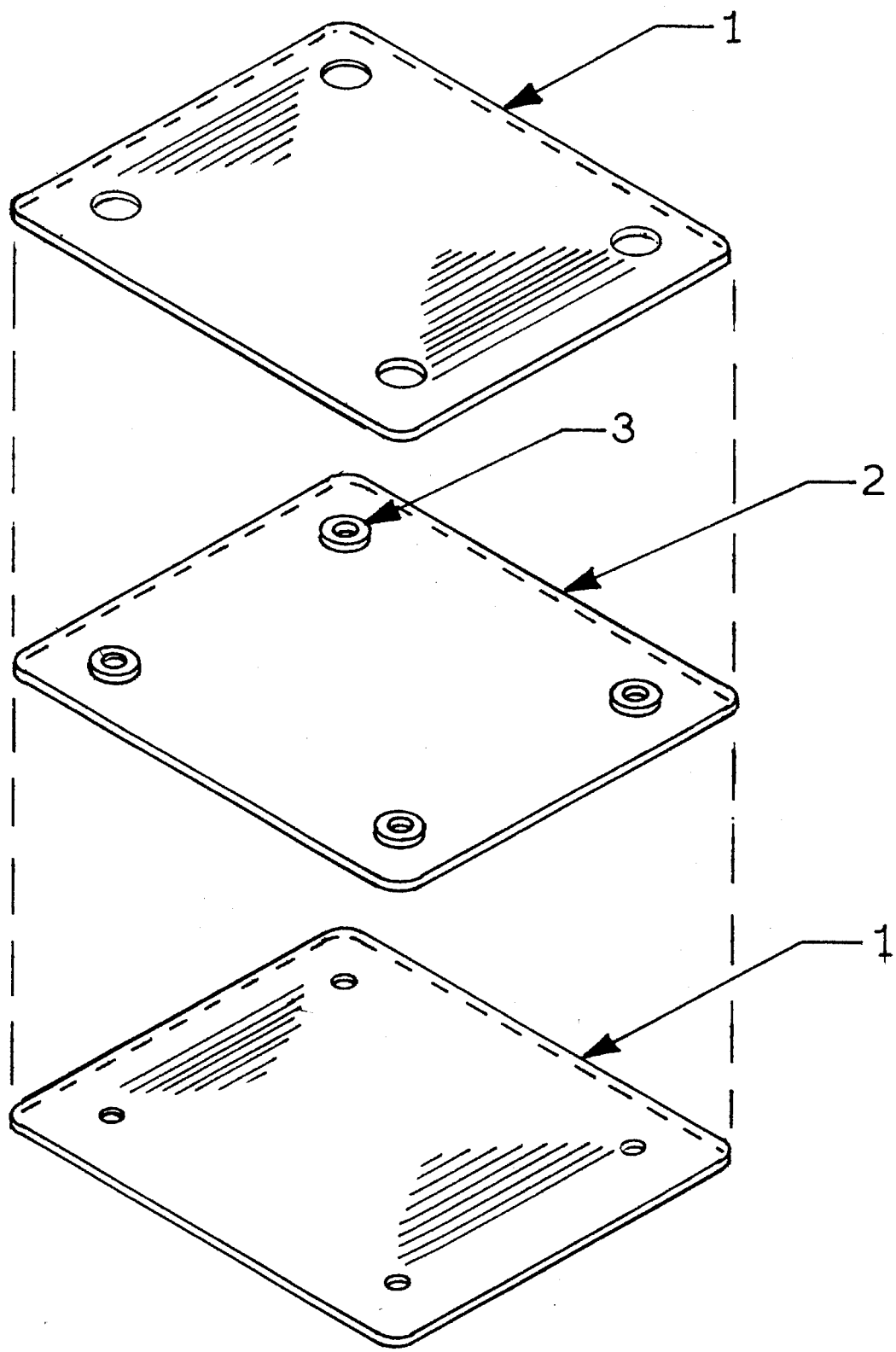
FIG. 1 is an exploded 3 dimensional view of a three layer embodiment of the invention.

Referring to FIG. 1, a three layer embodiment of the invention comprising a porous layer of conductive, flexible membrane (2), immobilized by encapsulation m two layers of fiberglass reinforced resin (1), with grounding apparatus (3) bonded to the conductive inner membrane (2) and immobilized by one side of the outer layers (1).

The electrically conductive material (2) may be any porous material having sufficient electrical conductivity and having a structure such that incident EMI signals presented to it will be substantially absorbed, reflected, or otherwise attenuated. Such electrically conductive materials include sintered porous metals, metallic sponges, etc. Other electrically conductive materials include sheets or films of porous expanded polytetraflouroethelene metal plated with copper/nickel, copper/gold, or other suitable electrochemical processes.

The preferred material for the electrically conductive membrane (2) is porous non-woven sheets or films of synthetic polymers. Such porous non-woven sheets or films may be prepared from such polymers as, but not limited to, polyamides, polyesters, polyolefins, polyurethanes, flouropolymers, and the like, by fiber processes known in the art as spin bonding, felting, or papermaking, or by pore forming processes known in the art such as foaming, stretching, or expansion. The material is only important in that it is flexible, can be formed into a variety of shapes, and is porous enough to allow penetration of resins and adhesives to encapsulate the inner structure of the material. The non-woven sheet or film is made electrically conductive by application of metals to the surfaces by metallizing processes known in the art such as sputter coating, vapor deposition, and the like, but preferably by electroless chemical deposition processes. There are many well known electroless chemical plating systems available on the open market that are suitable for plating the inner surfaces and outer surfaces of porous polymers.

The preferred material of the present invention for the electrically conductive inner membrane (2) is spun bonded polyester, commercially known as REMAY$^I$ from I.E. Dupont and Company, Wilmington, Del.

The material of the grounding apparatus (3) provides the electrical path for grounding any Electromagnetic Interference (EMI) signals absorbed by the flexible, conductive inner membrane (2), to the equipment chassis or any other apparatus to protect the internal electronic equipment from EMI signals.

The material for the grounding apparatus (3) can be any material suitable for mounting purposes such as, but not limited to, stainless steel, cadmium plated steel, anodized aluminum, nickel plated steel, or gold plated steel, copper, brass, etc. Importance being placed on the material to provide good electrical contact, strong support for mounting and torque loads, and corrosion resistance, when the enclosure is installed in ifs desired location.

The preferred material for the grounding apparatus (3) of the present invention is cadmium plated steel. The grounding apparatus (3) is bonded to the conductive inner membrane (2) with silver filled epoxy, or any conductive elastomer.

The material of the outer protective layers (1) form the protective barrier from liquids, gaseous solutions, and other corrosive elements to the electrically conductive inner layer (2). The outer protective layer may be any material having high strength, structural integrity, abrasion resistance, and chemical resistance. The material may be processed from any of the composite resin materials such as, but not limited to, thermoplastic resins and resin blends, phenolic resins, epoxy resins, and unsaturated polyester resins. The resins of the outer protective layers (1) may be re-inforced with fiberglass, glass beads metallic and non-metallic fibers, and the like. The most preferred material of the present invention for the outer protective layers (1) are fiberglass re-inforced polyester resin, widely known as gel-coat. Importance being placed on strength, chemical resistance, and moldability.

Figure 2:
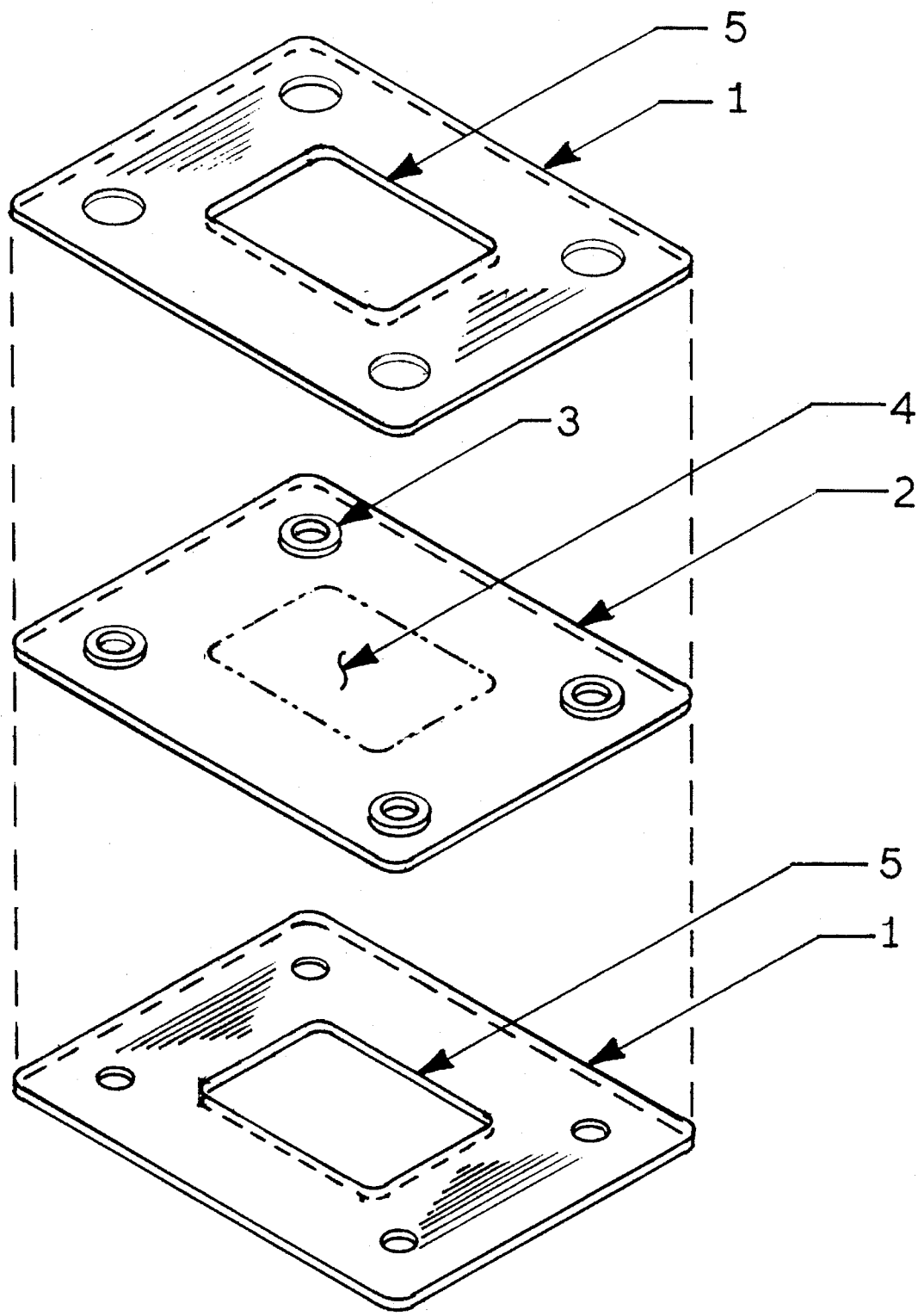
FIG. 2 is an exploded 3 dimensional view of a three layer construction with an integral air vent embodiment of the invention.

Referring to FIG. 2, a three layer embodiment of the invention with an integral ventilation section, comprises a porous conductive inner layer (2) with at least a small section (4) exposed to the atmosphere in order to allow passage of air flow through it. The bulk of the porous, electrically conductive inner layer (2), immobilized by encapsulation in two layers of fiberglass re-inforced resin (1).

The porous, electrically conductive material (2) is selected from the classes of materials described above in FIG. 1, provides the same EMI Shielding Attenuation, and may or may not be covered, coated, laminated, or sprayed with an amorphous copolymer such as, but not limited to, tetraflouroetholene (TFE), perflouro-2,2-dimethyl-1,3-dioxole, available from I.E. Dupont Company as Teflon® AF 1600 in which the dioxole concentration is about 65 percent mole, and as Teflon® AF 2400, in which the dioxole concentration is about 85 percent mole. The amorphous copolymer coating may also be applied from a dilute solution, for example a solution of perflouro-(2-butyltetratrydrofuran) solvent, known as Flouroinert-75 or FC-75 from Dow Chemical Co., containing copolymer solids with a concentration range of 0.01 to 0.05 percent weight.

The amorphous coating, if present, only need be found m the area of the open ventilation section to provide a protective barrier for the internal electronic equipment from passage of liquid or solid particulates in the local environment while allowing free passage of air through it for the purposes of cooling or pressure equilibration.

The outer protective layer (1) materials are selected from the classes described above in FIG. 1, and manufactured as previously described in FIG. 1.

An opening (5) in the outer protective layers should be molded or formed at the same time as the outer protective layers (1) are formed by any suitable means known in the art. The ventilation opening (5) may be of any size and shape required to produce the desired results for gaseous flow. The size and shape of said ventilation section (5) should not be of such size or shape as to adversely affect the strength or structural integrity of the material.

The material for the grounding apparatus (3) is selected from the classes of materials described above for FIG. 1, and bonded to the flexible, electrically conductive inner membrane (2) as described in FIG. 1.

Figure 3:
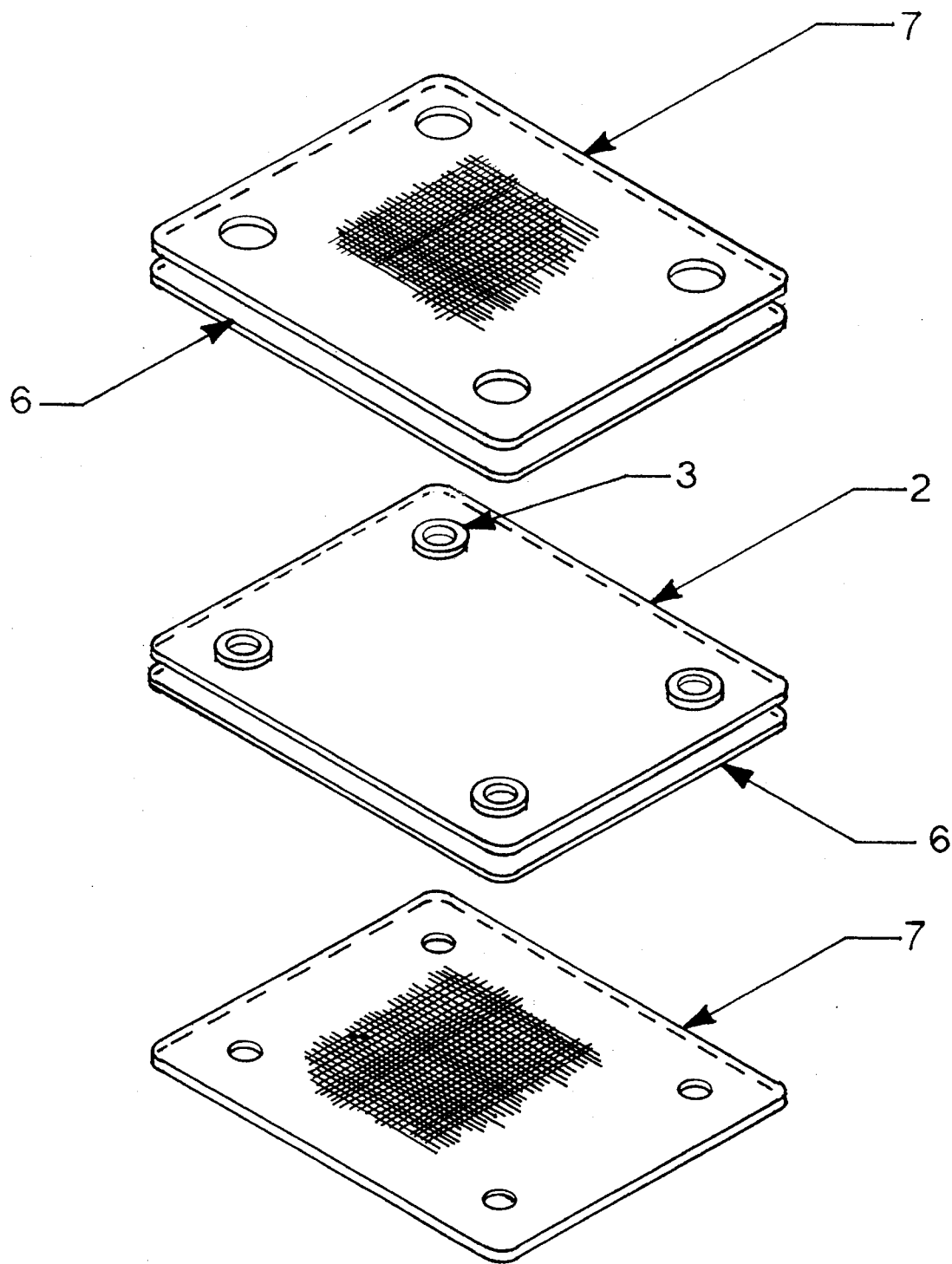
FIG. 3 is an exploded 3 dimensional view of a three layer, flexible embodiment of the invention.

Referring to FIG. 3, a flexible, three layer embodiment of the invention comprise a flexible, electrically conductive inner membrane (2), laminated to a flexible outer protective layer (7) with the use era flexible adhesive (6).

The flexible, electrically conductive inner membrane (2) may be selected from the classes of materials described above in FIG. 1, and will have the same EMI Shielding attenuation characteristics when laminated to a flexible outer protective material (7).

The outer protective material (7) may be selected from any suitable material known in the art, for strength, abrasion resistance, hydrophobic, and flexibility. The outer protective material (7) may be selected from the classes such as, but not limited to, canvas, nylon, rayon, polyesters, and the like. The preferred material of the present invention for the outer protective layer (7) is rip stop re-inforced nylon.

The adhesive material (6) may be selected from many classes known m the art and may be thermoplastic, thermosetting, or reaction curing types in liquid or solid forms. The adhesives may be selected from the classes such as, but not limited to, polyamides, polyesters, polyolefins, polyurethanes, or the like. The preferred adhesive (6) of the present invention is a thermoplastic polymer in the form of a mesh or non-woven web.

The grounding apparatus (3) of FIG. 3 may be selected from any of the classes described above in FIG. 1. The grounding apparatus (3) of the present invention should be in the form of metal eyelets, for example, such as found in canvas tarps and the like. The grounding apparatus (3) is made electrically conductive with the electrically conductive inner membrane (2) by means of crimping, swedging, or riveting the eyelet to the electrically conductive inner membrane (2) and the flexible outer protective layer (7).

TEST PROCEDURES

Air Permeability

The resistance of samples to air flow was measured by a Gurley Densemeter (manufactured by W. & L.E. Gurley and Sons) in accordance with test standard ASTM D726-58. The results are reported in terms of Gurley Number (Gurley Seconds) which is the time, in seconds for 100 cubic centimeters of air to pass through a 1 square inch of test sample at a pressure drop of 4.88 inches of water.

Electromagnetic Interference Shield Effectiveness (Attenuation)

EMI Shield Effectiveness is the resistance of a test sample to allow EMI signals to pass through it. EMI Shield Effectiveness of test samples was measured according to ASTM Standard Test Method D4935-89 for measuring the Electromagnetic Shield Effectiveness of Planer Materials; modified for use in measuring frequency ranges of 1 to 12 Gigahertz (GHz). Shield Effectiveness is reported in negative decibels (-dB) of attenuation.

Electrical Conductivity

Electrical conductivity for the electrically conductive inner membranes is measured in volume resistivity according to standard test methods described in MIL-G-83528, and is reported in terms of ohm-cm.

Electrical conductivity for assembled test samples is measured from ground lug to ground lug in accordance with standard linear electrical resistivity measurements for wire, etc. and is reported in ohms.

Corrosion Resistance

Corrosion resistance is the ability of a test sample to resist corrosion when subjected to severe environmental conditions. The corrosion resistance was tested in accordance with MIL-STD-810D, for salt fog and humidity environments and is reported in terms of pass or fail.

EXAMPLES

Example 1

A three layered embodiment of the present invention was prepared as follows:

A first porous spun bonded polyester membrane, approximately 0.019 inches thick was made electrically conductive by electroless chemical plating processes commercially available from Shipley Company and Enthone-OMI, with a first coating of electroless copper and a second coating of electroless nickel. The Shipley Company Electroless Copper 250 System was used for the copper plating, times and bath temperatures per manufacturers specifications. The second nickel coating was produced following manufacturers specifications from Enthone-OMI EN-426, electroless nickel without the use of any activator system. Properties of the membrane before and after plating are tabulated as follows:

|  | Before Plating | After Plating |
| --- | --- | --- |
| Density, g/cc | 0.272 | 0.361 |
| Pore Volume, % | 90 | 83 |
| Volume Resistivity, ohm-cm | >3 megaohm | 0.003 |
| Gurley, sec. | 0.2 | 0.2 |

One layer of outer protective, layer was prepared by first, cut and trimming 5 sheets of fiberglass 10.0 inches by 6.0 inches on a smooth dry surface, resin and hardener were mixed at a ratio of 10:1 by weight. The fiberglass sheets were layed flat and then saturated with the resin mixture and allowed to cure for 12 hours at room temperature. Alter curing, ¼ inch holes were drilled in the fiberglass plate for the purposes of accepting the grounding apparatus. Grounding apparatus was bonded to the electrically conductive inner membrane with silver epoxy, placement matched to the ¼ inch holes in the fiberglass plate. Another mixture of resin and hardener was prepared as before. The electrically conductive membrane was placed on the fiberglass plate, grounding apparatus located in ¼ inch holes, and saturated with the resin mixture. Before allowing to cure, five more fiberglass sheets were placed on top of the electrically conductive inner membrane and again saturated with the resin mixture. The assembly was allowed to cure at room temperature for 12 hours.

The finished three layer material of the invention was tested, conductivity testing was done using test points A through D as described by FIG. 1, and found to have the following properties:

| Density, g/cc | 1.54 |
| --- | --- |
| Thickness, inches | 0.138 |
| Deflection, inches, 10 lb load at 6.00 inches | 0.25 |
| Conductivity, ohms | |
| Points A to B | 0.06 |
| Points A to C | 0.06 |
| Points A to D | |
| Points B to D | 0.07 |
| Points B to D | 0.06 |
| Points B to C | 0.07 |
| Points C to D | 0.06 |
| Shield Effectiveness, -dB | |
| 3 GHz | 71 |
| 5 GHz | 83 |

-continued

| | |
|---|---|
| 7 GHz | 84 |
| 10 GHz | 101 |
| 12 GHz | 102 |
| Corrosion Testing, | |
| Salt Fog | Pass |
| Humidity | Pass |

Example 2

A three layer embodiment of the present invention with an integral ventilation section was prepared as follows:

A porous sheet of spun bonded polyester was first made electrically conductive with a first coating of electroless copper as described in example 1, and a second conductive coating of electroplated gold with Technics, Inc. OROSTRIKE' electroplating system. The copper plated membrane was submersed in a solution of OROSTRIKE' GOLD for 15 minutes at a temperature of 42° C., with a current of 2.5 amps. The properties of the plated material is tabulated as follows:

| | Before Plating | After Plating |
|---|---|---|
| Density, g/cc | 0.27 | 0.38 |
| Pore Volume, % | 89 | 81 |
| Volume Resistivity, ohm-cm | >3 megaohm | 0.002 |
| Gurley, sec. | 0.1 | 0.2 |

One layer of the outer protective layer was processed by first preparing 10 sheets of fiberglass webbing as described in example 1. Five sheets of fiberglass webbing was placed on a dry, smooth surface, previously treated with mold release. A section of the fiberglass webbing 1.50 inches by 1.50 inches was cut out of the center of the material for the ventilation section. The open area was masked off with a 0.060 inch thick block of polypropolene (treated with mold release) 1.50 inch by 1.50 inch. The fiberglass webbing was then saturated with a resin mixture and cured for 2 hours at 60° C. inches was cut out of the center of the material for the ventilation window. The open area was masked off with a 0.060 inch thick block of polypropolene (treated with mold release) 1.50 inch by 1.50 inch. The fiberglass webbing was then saturated with a resin mixture and cured for 2 hours at 60° C.

After curing, the fiberglass plate was drilled for the grounding apparatus, as described in example 1. The electrically conductive inner membrane was prepared as described in example 1 and positioned in place on the fiberglass plate. A second block of polypropolene 0.060 inches thick, 1.50 inches by 1.50 inches was positioned on the electrically conductive inner membrane directly over the previously positioned polypropolene block in the fiberglass plate. The electrically conductive inner membrane was saturated with resin mixture as described in example 1. The remaining five sheets of fiberglass webbing was positioned on the electrically conductive inner membrane, and around the second polypropolene block, and then saturated with the remaining resin mixture. Curing was completed in 3 hours at 60° C.

The finished three layered material, with an integral ventilation section, was tested and the results tabulated as follows:

Density, g/cc (non-ventilation area) 1.52
Thickness, inches 0.140
Air permeability, Guffey Sec. (ventilation area) 0.2

| | |
|---|---|
| Density, g/cc (non-ventilation area) | 1.52 |
| Thickness, inches | 0.140 |
| Air permeability, Gurley Sec. (ventilation area) | 0.2 |
| Shield Effectiveness, -dB | |
| 3 GHz | 73 |
| 5 GHz | 87 |
| 7 GHz | 89 |
| 10 GHz | 102 |
| 12 GHz | 102 |
| Corrosion Testing | |
| Salt Fog | Pass |
| Humidity | Pass |

Example 3

A flexible, three layered embodiment of the present invention was prepared as follows:

A first porous spun bonded polyester web was made electrically conductive with a first coating of electroless copper and a second coating of electroless nickel, as described in example 1. Conductivity and all other properties were similar in test results as previous samples in examples 1 and 2. The flexible electrically conductive inner membrane was laminated between two layers of woven nylon fabric, by interposing a layer of Sharnet' 4200 (nonwoven polyester adhesive webbing, manufactured by Applied Technologies, Inc.) between each layer and applying heat and pressure to the assembly by means of a hot press at 50° C. for 45 seconds at 100 pounds per square inch.

Next, a hole punch was used to punch ¼ inch diameter holes in the four corners, as shown in FIG. 3, for grounding apparatus. (Gold plated brass eyelets were crimped m place in the ¼ inch diameter holes, the finished assembly was tested and found to have the following properties:

| | |
|---|---|
| Density, g/cc | 0.52 |
| Thickness, inches | 0.032 |
| Air Permeability, Gurley sec. | 34 |
| Conductivity, ohms | |
| Points A to B | 0.09 |
| Points A to C | 0.09 |
| Points A to D | 0.11 |
| Points B to D | 0.08 |
| Points B to C | 0.10 |
| Points C to D | 0.10 |
| Shield Effectiveness, -dB | |
| 3 GHz | 71 |
| 5 GHz | 81 |
| 7 GHz | 86 |
| 10 GHz | 104 |
| 12 GHz | 103 |
| Corrosion Testing | |
| Salt Fog | Pass |
| Humidity | Pass |

It will become apparent to those skilled in the art that various modifications and variations can be made in the present invention. Thus it is intended that the present invention cover medications and variations of the invention provided that they come within the scope of the claims and their equivalents.

What I claim is:

1. A high strength, corrosion resistant composite material having electromagnetic radiation shielding properties comprising an inner layer of porous, electrically conductive membrane encapsulated within two outer protective layers with integral grounding apparatus bonded to the porous electrically conductive membrane.

2. The composite material of claim 1 wherein the electrically conductive membrane is a porous spun bonded polyester membrane with a first coating of electroless copper and a second coating of electroless nickel, the grounding apparatus is a ring of cadmium plated steel bonded to the electrically conductive membrane with silver fitted epoxy, and the outer protective layers are fiberglass-reinforced polyester resin.

3. The compound of claim 1 further including a integral ventilation section constructed by leaving a portion of the conductive inner membrane exposed both sides to the atmosphere through aligned openings in the outer protective layers.

4. The composite material of claim 3 in which the exposed portion of the conductive inner membrane is covered with an amorphous copolymer on at least one side.

5. A flexible, corrosion resistant composite material having electromagnetic radiation yielding properties comprising an inner layer of porous electrically conductive membrane bonded with a flexible adhesive to two outer layers of a flexible protective material with an integral grounding apparatus attached to the electrically conductive membrane.

6. The composite material of claim 5 in which the outer protective materials are woven nylon or other woven synthetic polymers.

7. The composite material of claim 5 in which the outer protective layers are a laminate of nylon and expanded polytetraflouroethelene.

8. The composite material of claim 5 in which the outer protective layers are woven cotton or canvas.

9. The composite material of claim 5 wherein the inner layer is spun bonded polyester web with a first coating of electroless copper and a second coating of electroless nickel, the outer protective layers are woven nylon fabric, the inner layer is bonded to the outer layers with a non-woven polyester adhesive webbing, and the grounding apparatus comprises a plurality of gold plated brass eyelets.

* * * * *